United States Patent [19]

Calvani et al.

[11] Patent Number: 5,007,735
[45] Date of Patent: Apr. 16, 1991

[54] METHOD OF CHARACTERIZING BISTABLE SEMICONDUCTOR LASERS

[75] Inventors: Riccardo Calvani, Pino Torinese; Renato Caponi, Turin, both of Italy

[73] Assignee: Cselt - Centro Studi e Laboratori Telecomunicazioni S.p.A., Turin, Italy

[21] Appl. No.: 337,383

[22] Filed: Apr. 13, 1989

[30] Foreign Application Priority Data

May 24, 1988 [IT] Italy ................................ 67475 A/88

[51] Int. Cl.$^5$ .......................... G01N 21/41; H01S 3/30
[52] U.S. Cl. ......................................... 356/128; 372/8
[58] Field of Search ............................ 356/128; 372/8

[56] References Cited

U.S. PATENT DOCUMENTS 4,873,690 10/1989 Adams .................................... 372/96
4,879,761 11/1989 Webb ..................................... 455/608

OTHER PUBLICATIONS

D. Milam and M. J. Weber, "Measurement of Nonlinear Refractive-Index Coefficients Using Time-Resolved Interferometry: Application . . . ", Journal of Applied Physics, vol. 47, No. 6, Jun. 1976 (pp. 2497-2501).

Primary Examiner—F. L. Evans
Assistant Examiner—K. P. Hantis
Attorney, Agent, or Firm—Herbert Dubno

[57] ABSTRACT

The characteristic parameters of a semiconductor laser (1) acting as an amplifier and brought to bistable operating conditions are determined. The output power (I2) of laser (1) is measured as a function of the power (I1) of an amplitude-modulated optical input signal to determine the laser hysteresis loop; the switching points (P1, P2) between the two stable states of the laser (1) are identified, the input and output power values relevant to such points are memorized, and at least the value of the non-linear refractive index coefficient ($n_2$) of the material used to fabricate the laser (1) as determined starting from the power values relevant to at least one of said points (P1, P2). By exploiting the power values relevant to both switching points (P1, P2) also the amplification factor (A), the finesse parameter (F) of the passive cavity of the laser (1) and the wavelength difference ($\lambda 1 - \lambda 2$) between the laser under test (1) and a second laser (3) generating the optical signal causing the laser under test (1) to operate under bistable conditions are measured.

9 Claims, 3 Drawing Sheets

METHOD OF CHARACTERIZING BISTABLE SEMICONDUCTOR LASERS

FIELD OF INVENTION

The present invention relates to semiconductor lasers and, more particularly, to a method of characterizing bistable semiconductor lasers.

BACKGROUND OF THE INVENTION

Bistability is a well known phenomenon, and the bistable behavior of a number of magnetic materials has been long since exploited in electronics in order to manufacture logic devices, in particular memory devices. The phenomenon is characterized by the existence of two values of an output quantity in correspondence with a given value of an input variable, the attainment of either output value depending on the direction in which the input value is made to vary.

More recently the same phenomenon has been observed in optical devices (interferometers) made of materials with non-linear properties, i.e. materials in which certain intrinsic parameters (such as refractive index and absorption constant) depend on the input power. More particularly, the refractive index of these devices can be expressed as the sum of a constant term and of a term depending on the power I of the signal sent to the device, according to the relation $$n = n_0 + n_2 \cdot I$$

where $n_0$ is the linear refractive index (which is constant), while $n_2$ is the so-called non-linear refractive index coefficient.

Owing to the present interest in optical communication systems, which allow much higher processing speeds than electronic components, it has been proposed to exploit optical bistability to implement optical logic circuits capable of replacing as mush as possible the electronic components in these systems. Optical memory devices to be used, e.g. in optical switching and processing, have been widely described in the literature; these devices use semiconductor lasers (or laser diodes), excited by optical or electrical pulses and caused to operate near the stimulated emission threshold. Under such conditions, in fact, the laser operates as an amplifier and has an optical power threshold, for switching from the spontaneous emission condition to the stimulated emission condition, different from the threshold which restores the device to the spontaneous emission condition. The existence of two switching thresholds gives rise to the bistable behavior of the device.

For a correct use of a laser under the conditions above, its characterization from bistability standpoint is also necessary and, more particularly, the non-linear refractive index coefficient should be determined. Various methods are known for measuring this coefficient in the non-linear material from which the device will be made. The simplest method is based on interferometric techniques and is described, e.g. by D. Milam and M. J. Weber in the paper entitled "Measurement of non-linear refractive index coefficient using time-resolved interferometry: Applications to optical materials for high-power neodymium lasers", Journal of Applied Physics, Vol. 47, 1976, pages 2497 ff.

According to this method, a sample of the material is introduced into an interferometer branch, a variable-intensity light beam is launched into the sample, so as to cause a refractive index variation, and the interference fringe shifts due to the refractive index variations are measured: $n_2$ is obtained from such shifts. A correct evaluation of the positions of the visibility maxima and minima requires an accurate digital processing of the experimental data to eliminate the noise present in the measurement.

No technique has, until now, been suggested for measuring $n_2$ directly under a device in operating conditions, This determination can be more significant than a determination made on the material, since it must be presumed that the non-linear refractive index coefficient, like the linear refractive index, is modified when the material is introduced into a device.

SUMMARY OF THE INVENTION

The invention provides a method for measuring the characteristic parameters of a semiconductor laser, which is biased by a current causing it to act as an amplifier and is brought into bistable operating conditions by an optical pump signal, obtained by amplitude modulation of a light beam emitted by a second semiconductor laser operating at a wavelength slightly exceeding that of the laser under test. According to the invention the laser output power is measured as a function of the input power to determine the hysteresis loop of the output power. The switching points betwee two laser stable states are identified by using the power values measured. The output and input power values relevant to such points are memorized and the non-linear coefficient of the refractive index of the non-linear material used for the laser fabrication is obtained from the output and input power values relevant to at least one of these points.

According to another characteristic of the invention, the amplification factor, the finesse parameter of the laser cavity and the wavelength difference between the laser under test and said second laser are also determined starting from the power values relevant to both switching points.

According to a further characteristic of the method, the laser reflected power is measured as a function of the input power to determine also the hysteresis loop of said reflected power, and the single-pass gain of the laser is determined starting from the values of the output power, the reflected power and the input power.

The method can be carried out by using the same equipment as used in the application of a bistable laser (e.g. in signal regeneration and/or amplification systems). This is an advantage over the known method, which theoretically could be employed for measuring the coefficient $n_2$ not only in the material but also in a device and yet in this case the measurement would be performed by using other equipment than those used in the practical applications of the bistable laser.

Besides, not only does the method of the invention permit non-linear refractive index coefficient measurement, but also a complete optical characterization of the laser.

BRIEF DESCRIPTION OF THE DRAWING

The above and other objects, features and advantages of my invention will become more readily apparent from the following description, reference being made to the accompanying highly diagrammatic drawing in which.

SPECIFIC DESCRIPTION

Figure 1:
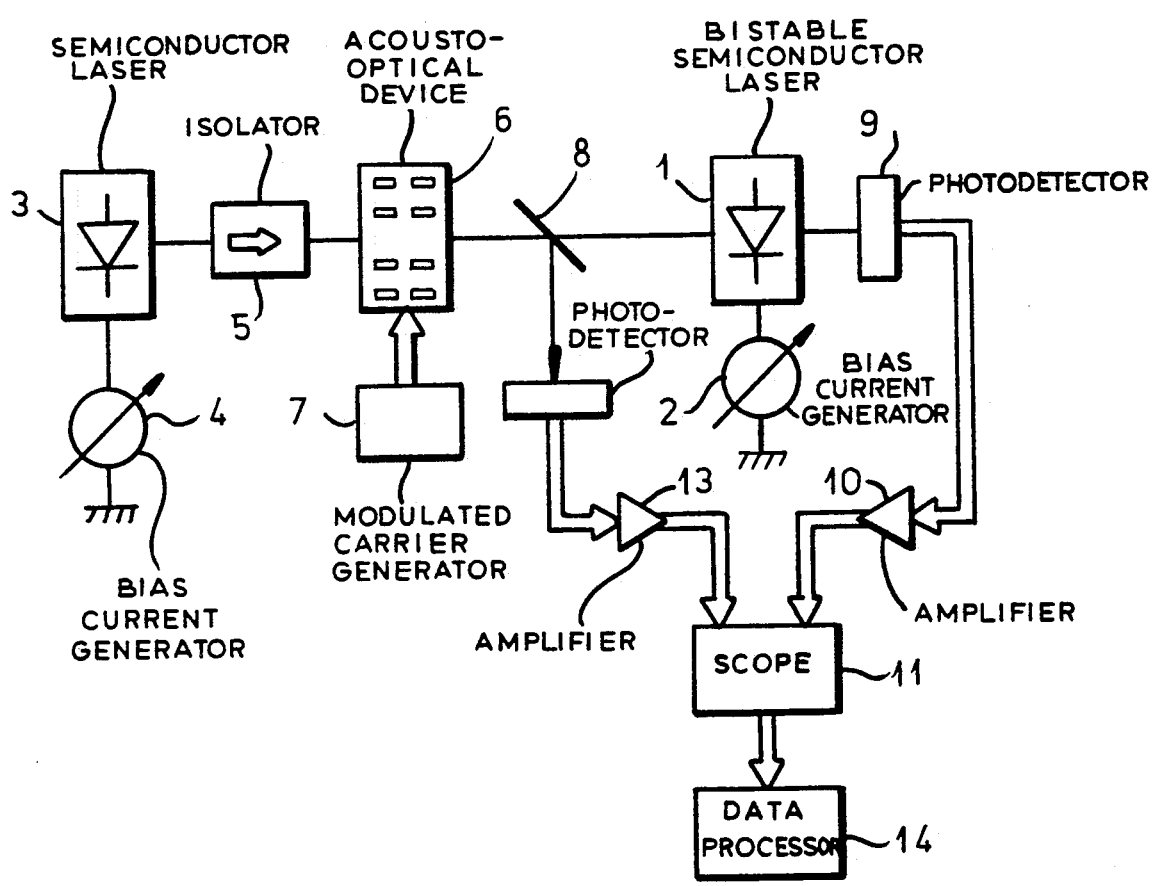
FIG. 1 is a schematic representation in block-diagram form of the apparatus used for performing the method.

In FIG. 1, where double lines represent electrical connections and single lines optical signal paths, the bistable semiconductor laser 1 under test, which is a conventional single-longitudinal mode laser, is shown to be connected to a generator 2 of a highly stable bias current, such as to make laser 1 operate near its threshold and act as an amplifier. As is known, bistable operation of a semiconductor laser is obtained by launching into said laser an optical pump signal, having a wavelength slightly different from that emitted by laser 1. That pump signal is generated by a second semiconductor laser 3, analogous to laser 1, connected to a respective bias current generator 4, which also is highly stable. For simplicity of illustration the systems for stabilizing the laser working temperature are not shown since their function is of no interest for the invention.

According to the present invention, when carried out by the apparatus shown in FIG. 1, characterization of laser 1 exploits the laser hysteresis loop expressed by the intensity of the light outgoing from the laser as a function of the input light intensity. To build up the hysteresis loop, the beam generated by laser 3 is sent via an isolator 5 to an acousto-optical device 6, fed with an amplitude-modulated carrier, more particularly a carrier modulated by a sinusoidal signal. The purpose of insulator 5 is to preventing back-reflections which could annoy the measurement. Reference 7 schematically represents all of the devices generating the modulated carrier. The beam outgoing from acousto-optical device 6 (e.g. the beam deflected into the first Bragg diffracted order), which has a sinusoidally varying intensity, is sent to a beam splitter 8 forming a transmitted partial beam and a reflected partial beam. The transmitted partial beam is sent to the laser 1 under test, it is optically amplified by laser 1 and then is collected by a photodetector 9 whose output is connected, through an amplifier 10, to input y of a memory oscilloscope 11 operated in x-y mode. The partial beam reflected by beamsplitter 8 is collected by a second photodetector 12 whose output is connected through an amplifier 13 to input x of oscilloscope 11. For the sake of simplicity, the various optical system for collimating, focusing etc. the light beams have not been shown as they are of no interest to the present invention.

Oscilloscope 11 stores the amplitude values of the signal outgoing from photodetector 9 (which are proportional to the values of intensity I2 of the beam outgoing from laser 1) as the amplitude of the signal outgoing from photodetector 12 (which amplitude is proportional to intensity I1 of the beam injected into the laser varies. The transmission hysteresis loop of laser 1 is built up in this way. A data processing device 14, connected to oscilloscope 11, identifies switching points P1, P2 between the two states and, starting from values I2(P1), I1(P1), I2(P2), I1(P2) of I2 and I1 at such points, it calculates either the non-linear refractive index coefficient alone or this coefficient and other parameters characterizing the laser, more particularly the amplification factor, the finesse parameter and the wavelength difference between the emitted signal and the pump signal.

Switching points P1, P2 can be identified either by obtaining the laser transmittivity from values I2, I1, or directly from the hysteresis loop.

Laser transmittivity can also be exploited in a check phase, wherein at least the correctness of value of $n_2$ can be verified starting from the transmittivity maximum.

Figure 2:
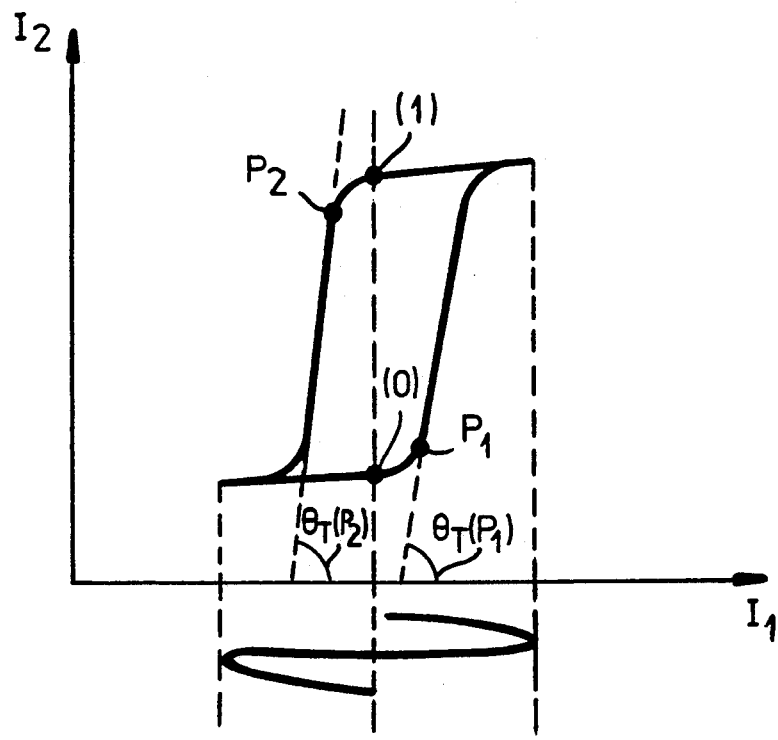
FIG. 2 is a graph which shows the transmission hysteresis loop of the laser.
Figure 3:
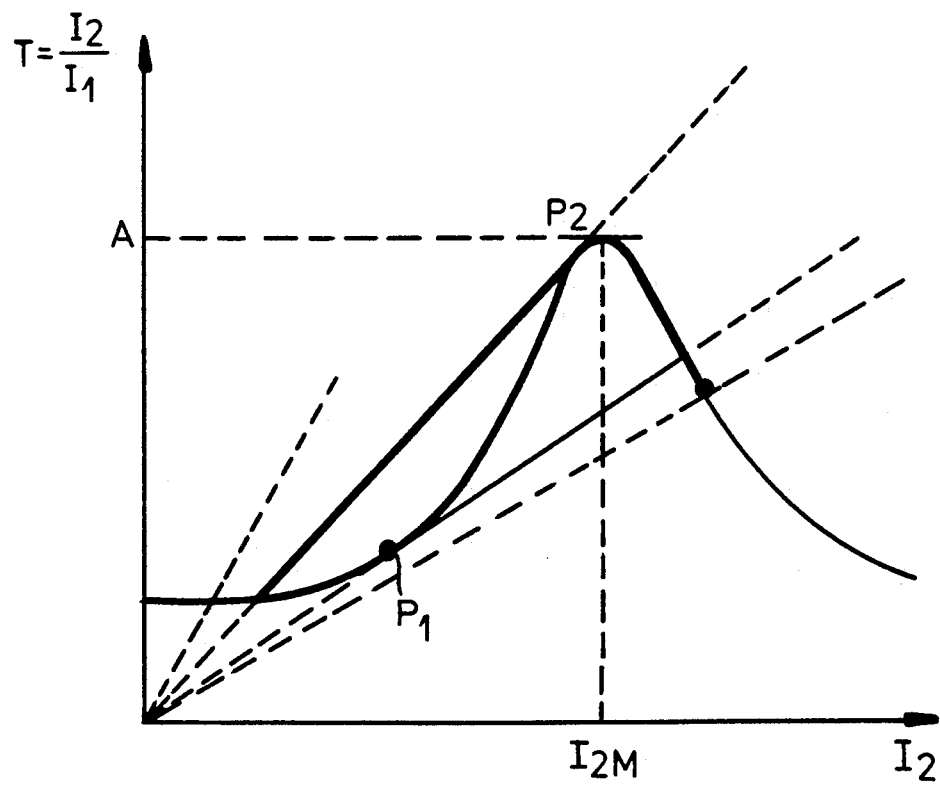
FIG. 3 is a diagram of the laser transmittivity versus the intensity of the beam outgoing from the laser itself.

FIG. 2 shows the hysteresis loop of I2 versus I1, and FIG. 3 transmittivity T versus I2. Straight lines represents T and T is expressd by ratio I2/I1; the curve represents on the contrary the function $$T = \frac{A}{1 + AF \sin^2\left[2\pi\left(\frac{\lambda_2 - \lambda_1}{\lambda_1 \lambda_2} \cdot L \cdot n_0 + \frac{L}{\lambda_1} n_2 I_2\right)\right]} \quad (1)$$

which links T to the parameters of the laser, considered as a non-linear Fabry-Perot interferometer whose cavity is filled with a material having refractive index $n = n_0 + n_2 \cdot I_2$. The relation is valid in the small optical signal approximation (far from gain saturation, as applies when laser 1 is used as an amplifier) and assuming for simplicity a plane wave propagation. In this relation: I2, I1, $n_0$, $n_2$ have the already-examined meanings; $\lambda_1$, $\lambda_2$ are the wavelengths of lasers 3 and 1, respectively; A is the amplification factor of laser 1 under resonance conditions; F is the finesse parameter of the passive cavity of length L and resonance wavelength $\lambda_2$. Only the first peak of the curve representing relation (1) has been considered, namely the peak for which the argument of the sine function in the denominator is 0. The operations condition in which such peak is exploited is easily obtained by a suitable choice of the wavelength difference between lasers 1 and 3, more particularly by exploiting the resonance wavelength $\lambda_2$ of laser 1 closest to $\lambda_1$. In an exemplary embodiment, wavelengths $\lambda_1$ and $\lambda_2$ were 832.1 nm, and 831.9 nm, respectively. The dashed area in FIG. 3 corresponds to the hysteresis loop of FIG. 2.

The theoretical principles on which the method of the invention is based will now be disclosed in more detail, with reference also to the diagram of FIGS. 2 and 3.

As mentioned, in order to obtain $n_2$, switching points P1, P2 between the two stable states must be identified and this can be made by either exploiting the transmittivity T as defined or directly starting from the hysteresis loop.

The method which exploits transmittivity is based on the consideration that these points are those at which, as I2 varies, the straight lines and the curve in FIG. 3 are mutually tangent. Such points can be determined by calculating the first derivatives, with respect to I2, of the two expressions of T and by setting such derivatives equal to one another. Indicating for the sake of simplicity by $\phi$ the argument of the function $\sin^2$ in the denominator of equation (1), relation $$\frac{1}{I1(Pi)} = \frac{2n_2 \cdot L \cdot A \cdot F \cdot \sin\phi\cos\phi}{\lambda_1 \cdot (1 + AF \sin^2\phi)} \quad (2)$$

is obtained for the generic switching point Pi (with i=1, 2). Let us suppose that only coefficients $n_2$ of a laser of which A, F, $\lambda_2-\lambda_1$ are known is to be measured. By replacing sin $\phi$ by its value expressed as a function of I1(Pi), I2(Pi) (which value can be extracted from (1) and expressing cos $\phi$ as a function of sin $\phi$, relation (2) immediately provides $n_2$, which is the only known parameter and is given by relation $$n_2 = \frac{I_1\lambda_1}{4\pi L I_2 \sqrt{I_1 - I_2/A} \sqrt{FI_2 - I_1 + I_2/A}} \quad (3)$$

It is clear that the identification of a single switching point Pi is sufficient to determine $n_2$. Yet $n_2$ can be advantageously obtained also from the data relevant to the other switching point, and the average between the two values thus computed can be taken as actual value of $n_2$.

Identification of both switching points is on the contrary necessary to determine also A, F and $\lambda_2-\lambda_1$, in addition to $n_2$. By introducing into relations (1) and (2) the power values relevant to points P1 and P2, a 4-equation system in the four above-mentioned unknown quantities is obtained, which system can be solved by processor 14.

The method of identifying points P1, P2 directly from the hysteresis loop is based on the observation that such a loop presents two straight-line segments indicating the transitions from one state to the other. The starting points of such straight-line segments (with reference to the direction of variation of I1) are two switching points. Processing device 14 can easily obtain, from the measured values of I2 and I1, the straight lines best approximating such portions and recognize the switching points as the points wherein the straight lines and the curve are no longer coincident.

Advantageously, the method of the invention provides, besides the characeterization step, a step in which there is checked the correctness of the value of n2 determined by either method described above, and possibly also of the value of A. For such check, the values of T are determined by exploiting the values of I1 and I2 already used to obtain the hysteresis loop, and the values of I2 and I1 where transmittivity is maximum are determined. Taking into account relation (1) and by indicating again by $\phi$ the argument of function sin$^2$, it is evident that such maximum value is reached when $\phi=0$ (in the hypothesis that wavelength difference $\lambda_2-\lambda_1$ is chosen so as to exploit the resonance peak of laser 1 closest to $\lambda_1$). By substituting in the expression of $\phi$ the value of I2 for which such maximum occurs, the value of n2 is obtained, expressed by $$n_2 = \frac{n_0(\lambda_1 - \lambda_2)}{\lambda_2 \cdot I_2} \quad (4)$$

In addition, since the maximum value of T is A, as it can be immediatedly deduced from (1), there is also a check on the measurement of the amplification factor, if such a measurement is made.

Figure 4:
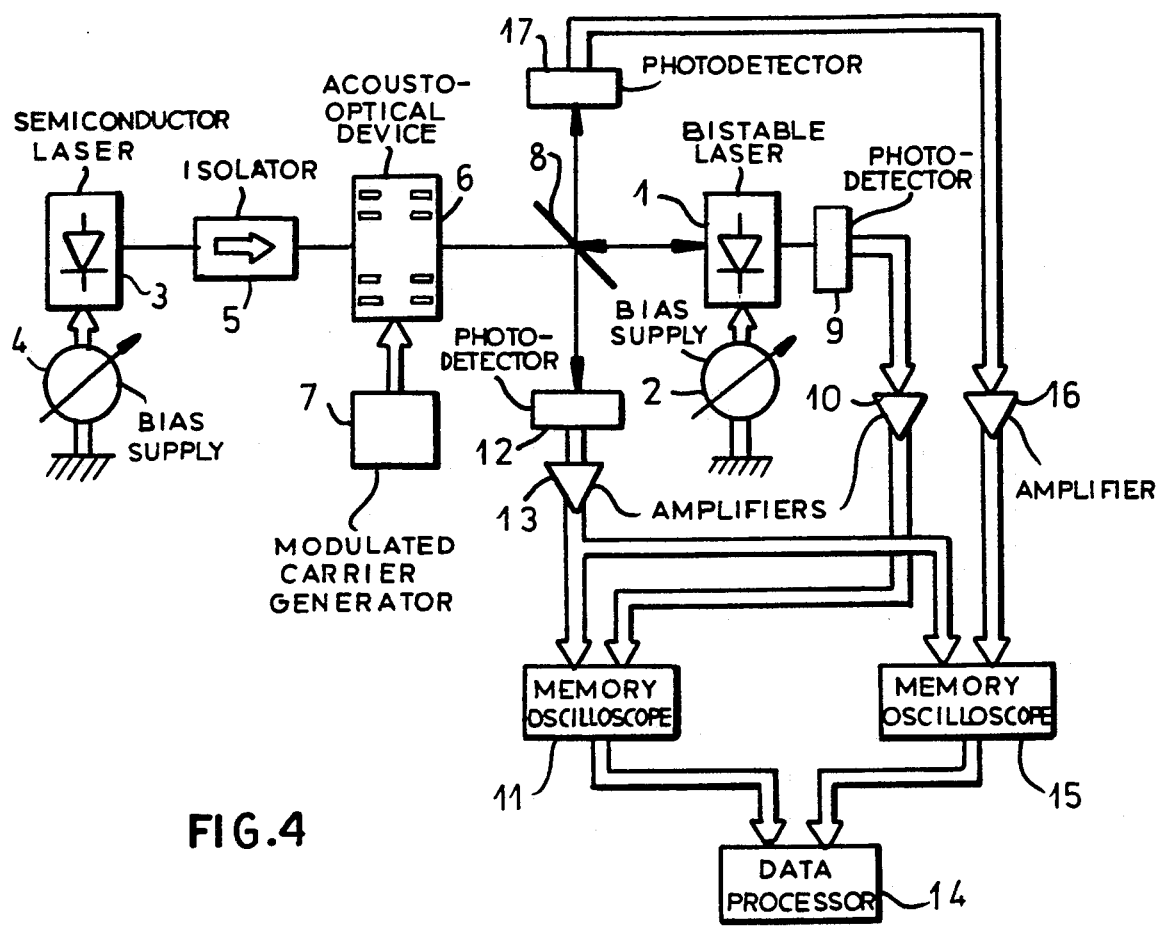
FIG. 4 is a schematic representation, partly in block diagram form, of a variant of the apparatus.

The apparatus shown in FIG. 1 can be modified as shown in FIG. 4 so as to measure the power reflected by laser 1 in order to allow determination also of the single-pass gain G of the laser. The knowledge of G allows also a different determination of amplification factor A which, in the same conditions of validity of relation (1), is expressed by $$A = (1 - r)^2 G/(1-rG)^2 \quad (5)$$

where r is the reflectivity of the laser facets. Thus, a further check of the measurement based on the transmission hysteresis loop is possible.

Figure 5:
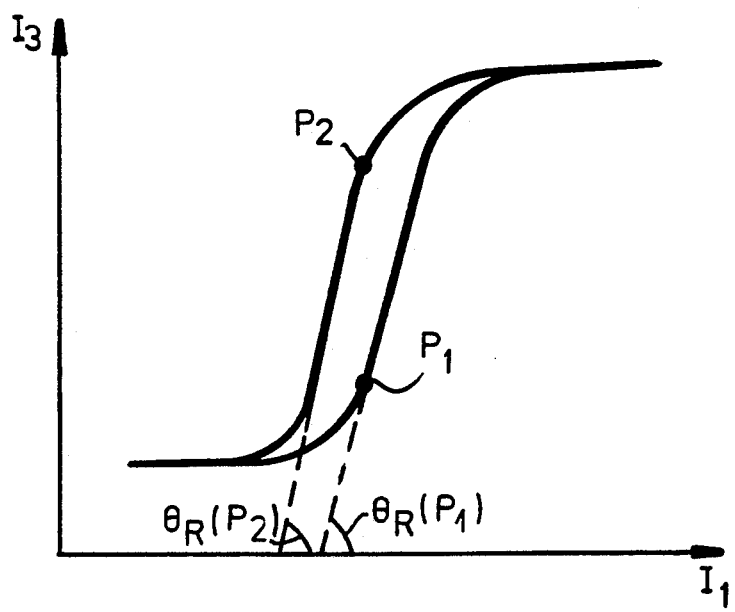
FIG. 5 is a graph which represents the reflection hysteresis loop.

As shown in FIG. 4, the output signal of amplifier 13 (which is proportional to laser input power I1) is sent also to input x of a second memory oscilloscope 15 operated in x-y mode. Input y of oscilloscope 15 is fed, via an amplifier 16, with the output signal of a further photodetector 17 which receives, via beam splitter 8, a light signal consisting of the pump signal fraction reflected by the input face of laser 1. Like oscilloscope 11, oscilloscope 15 stores the amplitude values of the output signal of detector 17, proportional to intensity I3 of the beam reflected by the laser 1, as intensity I1 of the pump signal varies. Thus the reflection hysteresis loop is built, as shown in FIG. 5.

Processing device 14, connected also to the output of oscilloscope 15, determines the angular coefficients of the straight lines which approximate the transmission and reflection hysteresis loops in the switching regions, and calculates single-pass gain G starting from such angular coefficients.

The theoretical considerations on which the invention is based for the determination of G are as follows. Input power I1, transmitted power I2 and reflected power I3 are mutually linked by relation $$I3 = I1 + BI2$$

which, denoting by R the laser reflectivitY I3/I1, corresponds to relation R−1+BT where B, under the same conditions of validity of (1), is expressed by $$B = (rG^2 - 1)/G \cdot (1-r) \quad (6)$$

According to the invention, in order to determine G, the value of B is calculated starting from relation $$B = (I3 - I1)/I2 \quad (7)$$

Now, B is a constant quantity, as r is a constant stucture parameter and G is constant under the condition where relations (1)and (6) apply. Therefore, the first derivative of B with respect to I1 will be 0 whatever the point where it is calculated, and in particular in the straight-line switching regions of the hysteresis loops including switching points P1, P2. By setting the derivative equal to 0, the following relations are obtained:

$$I2(Pi) \cdot [b(Pi) - 1] - a(Pi) \cdot [I3(Pi) - I1(Pi)] = 0 (i=1,2) \quad (8)$$

where a (Pi)=(dI2/dI1)$_{Pi}$=tg$\theta_T$(Pi) and b(Pi)=(dI3/dI1)$_{Pi}$=tg$\theta_R$(Pi) are the angular coefficients of the straight-line segments of the transmission and reflection hysteresis loops, respectively. From relations (7) and (8) two values of B are obtained, according to relations $$B(Pi) = [b(Pi) - 1]/a(Pi) \quad (9)$$

Generally, said values do not coincide, because the straight-line portions of each hysteresis loop are not exactly parallel. Thus, it will be convenient to calculate G from a weighted average value Bm of B, expressed by relation $$Bm = [a(P_i)\cdot B(P_1) + a(P_2)\cdot B(P_2)]/[a(P_1)+a(P_2)] \qquad (10)$$

which is obtained from relation (9) by replacing a and b by a respective mean value. Then an average value Gm $$Gm = [(1-r)Bm + \sqrt{(1-r)^2 Bm^2 + 4r}]/2r \qquad (11)$$

of single-pass gain can be obtained by introducing (10) into ($\neq$) and solving with respect to G.

It is to be pointed out that facet reflectivity r, if it is not known in advance, may be determined in a calibration phase of the equipment by measuring the power reflected by laser 1 in idle conditions.

Value Gm may subsequently be employed to calculate A according to relation (5).

We claim:

1. A method of measuring characteristic parameters of a bistably operating semiconductor laser which comprises the steps of:
   (a) biasing said bistably operating semiconductor laser with a current causing said bistably operating semiconductor laser to function as a laser amplifier;
   (b) generating an optical pump signal by modulating a light beam emitted by a pumping semiconductor laser at a pumping wavelength exceeding an operating wavelength of said bistably operating semiconductor laser and energizing said bistably operating semiconductor laser with said pump signal to cause bistably operating semiconductor laser to operate in a bistable operating condition;
   (c) measuring an output power (I2) of a light beam emitted by said bistably operating semiconductor laser and measuring an input power (I1) of pump signal energizing said bistably operating semiconductor laser;
   (d) determining a hysteresis loop formed as a relationship of said output power (I2) to said input power (I1) having switching points (P1, P2) between two stable states of said bistably operating semiconductor laser;
   (e) memorizing values of said input and output powers of each of said points; and
   (f) computing from memorized values of said input and output powers of at least one of said points a value (n2) of a nonlinear coefficient of refractive index of material constituting said bistably operating semiconductor laser.

2. The method defined in claim 1, further comprising the step of determining said switching points by:
   calculating a transmittivity of said bistably operating semiconductor laser from said input and output power value (I1, I2) and expressing the calculated transmittivity as a ratio between said input and output powers;
   calculating a transmittivity of said bistably operating semiconductor laser from said input and output power value (I1, I2) and expressing the calculated transmittivity as a function of other laser parameters including said value (n2) of said nonlinear coefficient of refractive index of material constituting said bistably operating semiconductor laser and said wavelengths; and
   selecting as said switching points, points at which first derivatives with respect to said output power of the transmittivities expressed as a ratio between said input and output powers and as a function of other laser parameters are equal.

3. The method defined in claim 1, further comprising the step of determining said switching points by selecting points at which linear portions of said hysteresis loop have transitions into curvilinear portions thereof.

4. The method defined in claim 1, further comprising the step of determining an amplification factor (A) and a finesse parameter (F) of said bistably operating semiconductor laser, and a difference ($\lambda_2 - \lambda_1$) between said wavelengths of said bistably operating semiconductor laser and said pumping semiconductor laser.

5. The method defined in claim 1, further comprising the step of:
   checking correctness of the value (n2) of said nonlinear coefficient of refractive index of material constituting said bistably operating semiconductor laser by measuring a transmittivity of said bistably operating semiconductor laser as a function of said output power (I2);
   determining a maximum of the measured transmittivity; and
   calculating said value (n2) of said nonlinear coefficient of refractive index of material constituting said bistably operating semiconductor laser from a value of said output power at said maximum.

6. The method defined in claim 4, further comprising the steps of:
   measuring a reflected power (I3) of light reflected by said bistably operating semiconductor laser as a function of said input power (I1) to determine a reflected power hysteresis loop; and
   determining a single-pass gain of said bistably operating semiconductor laser from values of said reflected power (I3), said output power (I2) and said input power (I1).

7. The method defined in claim 6 wherein the determination of said single-pass gain comprises the steps of:
   determining angular coefficients of straight lines which, in said hysteresis loops, approximate transition regions between said stable states of said bistably operating semiconductor laser;
   calculating from said angular coefficients a value of a parameter linking laser reflectivity and transmittivity and is a function of said gain; and
   computing said gain from the value of said parameter linking laser reflectivity and transmittivity.

8. The method defined in claim 7 wherein an average value of said gain is determined from a weighted average of said value of said parameter linking laser reflectivity and transmittivity obtained from an average value of said angular coefficients of two straight lines which, in each of said hysteresis loops, approximate switching regions.

9. The method defined in claim 6 wherein said amplification factor is calculated from said single-pass gain for checking a measurement of said amplification factor derived from the hysteresis loop of said output power.

* * * * *